United States Patent [19]

Csicsatka

[11] 3,899,743

[45] Aug. 12, 1975

[54] BIASING CIRCUIT FOR MULTISTAGE TRANSISTOR AMPLIFIERS

[75] Inventor: Antal Csicsatka, Decatur, Ill.

[73] Assignee: General Electric Company, Syracuse, N.Y.

[22] Filed: Jan. 7, 1974

[21] Appl. No.: 431,505

[52] U.S. Cl. .................... 330/22; 330/19; 330/25; 330/28; 330/85

[51] Int. Cl.$^2$ .................... H03F 3/04

[58] Field of Search .......... 330/16, 19, 22, 23, 25, 330/28, 40, 85, 96

[56] References Cited

UNITED STATES PATENTS 2,916,565 12/1959 Ensink et al. .................. 330/28 X

*Primary Examiner*—R. V. Rolinec
*Assistant Examiner*—Lawrence J. Dahl
*Attorney, Agent, or Firm*—Marvin A. Goldenberg

[57] ABSTRACT

A novel circuit is disclosed for biasing the first transistor stage of a multistage transistor amplifier. The circuit comprises a semiconductor device, typically a transistor, connected to a feedback relationship between the output and input electrodes of the transistor amplifier for providing the requisite DC current bias to the base of the first transistor stage while maintaining the collector voltage at the output transistor stage substantially constant, independent of varying $\beta$ characteristics of the transistor amplifier.

8 Claims, 5 Drawing Figures

BIASING CIRCUIT FOR MULTISTAGE TRANSISTOR AMPLIFIERS

BACKGROUND OF THE INVENTION

In the construction and operation of transistor amplifiers it is necessary to establish the proper bias conditions for providing appropriate operation of the amplifier. For example, for NPN transistors in the common emitter mode, it is necessary to bias the collector of the first as well as subsequent stage transistors of the amplifier at a positive potential. It is equally necessary that a bias be placed between the base and emitter of the transistor of the first stage such that the first stage will always be in the active mode regardless of the variation in signal levels at the input. In other words, a DC bias current level appropriate to prevent saturation or turn off the transistor of the first stage must be provided at the base. This DC level must be of a sufficient value to always bias the base positive with respect to the emitter regardless of the voltage variation of the input signal.

The prior art has typically solved this problem by providing a bias resistance connected from a source DC bias potential to the base of the first transistor stage. This resistance provides a positive DC bias in the case of an NPN transistor between the base and emitter thereof and supplies sufficient DC base current.

However, because characteristics vary from transistor to transistor, the input base bias current requirements are dependent upon $\beta$ characteristics of these transistors, these characteristics may also vary from transistor to transistor. It is therefore necessary to test the input transistor of each individual amplifier, which may be manufactured as part of an integrated circuit, to determine the input characteristics thereof and select a bias resistance value required by the input stage transistor of the individual amplifier. This testing requires much time and expense in fabrication of circuits utilizing such amplifiers and requires precise trimming of thin film resistances or fabrication or selection of resistances when utilizing integrated circuits incorporating such amplifiers. This testing and resistance fabrication or selection greatly increases the cost of manufacturing such circuits.

The bias resistance frequently also provides a feedback path from the collector of the output stage transistor to the base of the input stage transistor. For overall high amplifier gain this resistance value must be high. If this resistance is high, $\beta$-variation in the first stage transistor causes base bias current variation in the base bias resistance, which causes the voltage at the collector of the output stage to vary considerably with $\beta$.

It is one object of the invention to provide a biasing circuit which stabilizes the DC collector voltage of the output stage of a multistage transistor amplifier.

It is another object of the present invention to reduce or eliminate the necessity to test for variation in the first stage of such multistage transistor amplifier.

It is another object of the invention to eliminate the necessity of selecting a bias resistor specifically required for the input stage of individual amplifiers.

It is another object of the invention to provide a circuit for biasing the input stage of transistor amplifiers in a manner which is independent of variation.

SUMMARY OF THE INVENTION

The above as well as other advantages and objects of the present invention are obtained by the circuits described in this specification for biasing the first stage of a multistage transistor amplifier. In one form, the biasing circuit comprises a semiconductive element which applies a DC bias current to the base of a first stage transistor of a velue sufficient to insure that the transistor will operate in the active mode. The circuit accomplishes the biasing independent of variation.

DESCRIPTION OF THE DRAWINGS

These and other objects and advantages of this invention will become apparent from the following description and drawings wherein.

Figure 1:
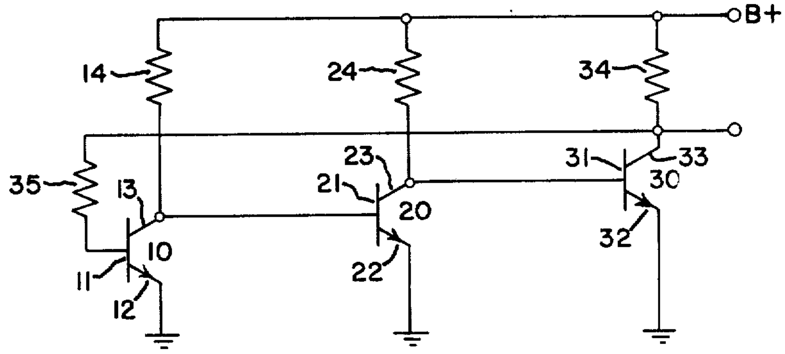
FIG. 1 shows the prior art circuit, employing a bias resistor to effect base bias of the first stage transistor.

In order that the operation and purpose of the invention be best understood, the operation of a prior art biasing arrangement for a typical common-emitter multistage NPN transistor amplifier will be described. Such an amplifier is shown in FIG. 1 and may consist of three NPN transistors 10, 20 and 30 connected in a common emitter mode. The input to the amplifier is applied between the base 11 and the emitter 12 of the transistor 10. The output signal of the amplifier is taken between the collector 33 of transistor 30 and a common point corresponding to the common emitter connection. Each of the stages corresponding to the respective transistors 10, 20 and 30 is biased in active stage for operation of the amplifier by means of load resistors 14, 24 and 34 connected to the collectors of the respective transistors. These resistors apply appropriate bias voltage from a source of bias potential to the collectors 13, 23, and 33 respectively. As is shown, the collector of the previous stage is connected to the base of the subsequent stage in the amplifier. The collector 13 of transistor 10 is connected to the base 21 of transistor 20 and the collector 23 of transistor 20 is in turn connected to the base 31 of transistor 30. Of course, merely biasing collectors is not of itself sufficient to bring the amplifier into a state of operation; it is also necessary to insure sufficient bias current into the base 11 of the first stage transistor 10 and insure sufficient base current to maintain transistor 10 in the active state, the prevent voltage swings about the input which may turn off or saturate the transistor 10.

A resistance 35 supplies DC bias voltage and current from a direct current voltage source to the base 11. For example, resistance 35 is connected to the collector 33 of transistor 30 and the resistance 35 supplies a DC voltage at base 11 by means of load resistance 34. As is well known to those familiar with the design of transistor amplifiers of this type, the bias resistance 35 must be chosen such that an adequate DC bias current is provided at the base 11. For example, if the DC voltage drop is 3v across the load resistance 14 of 2kΩ, then 1.5 mg bias current must flow into the collector 13 of transistor 10. This means that for $\beta$ values between 50 and 200, the necessary base DC current bias to provide 1.5 mg collector current in the active regions is approximately between 7 and 30 $\mu$a.

Since resistance 35 acts as a negative feedback network between the collector 33 of transistor 30 and the base 11 of transistor 10, the value of resistance 35 must be large to reduce the amount of negative feedback if large overall amplifier gain is desired. For audio amplications resistance 35 must be about 10–20kΩ if amplifier gains of around 1000–2000 are to be obtained.

If resistance 35, for example, is 20kΩ and if the base bias current for transistor 10 flowing through resistance 35 is 7–30 $\mu$a then the voltage drop across resistance 35 is (20kΩ) (7–30) $\mu a \approx 0.4 \pm 0.2v$ if the $\beta$ of transistor 10 varies between 50 and 200 and the dc bias collector current is 1.5 ma.

Since the voltage at collector 33 of transistor 30 is equal to the voltage drop across resistor 35 plus the base-to-emitter voltage drop of transistor 10 and since the base-to-emitter voltage of a conducting or active transistor is about .65v, the collector voltage of transistor 30 is:

$$0.65 + 0.4v \pm 0.2v \approx 1.0V \pm 0.2v$$

for $\beta$ values between 50 and 200 at transistor 10.

It can be seen that for the circuit parameter values used above, the DC collector voltage may vary as much as 20% for $\beta$ variation between 50 and 200 for transistor 10. It is highly desirable to have a more stable bias at the collector of the output stage so that the amplifier can maintain a constant quiescent point and insure the amplifier operates in the range of highest dynamic response if the amplifier is to be used in audio applications.

Also, if the transistor amplifier is provided as an integrated circuit, without providing resistor 35 it is necessary to test each individual integrated circuit to obtain the input characteristics for that circuit. Then a resistance 35 must then be selected for use whose value is determined by the $\beta$ of the first stage transistor 10 to effectively forward bias the base of the first transistor. Testing and resistance selection, in conjunction with such an amplifier, are expensive and time-consuming.

Figure 2:
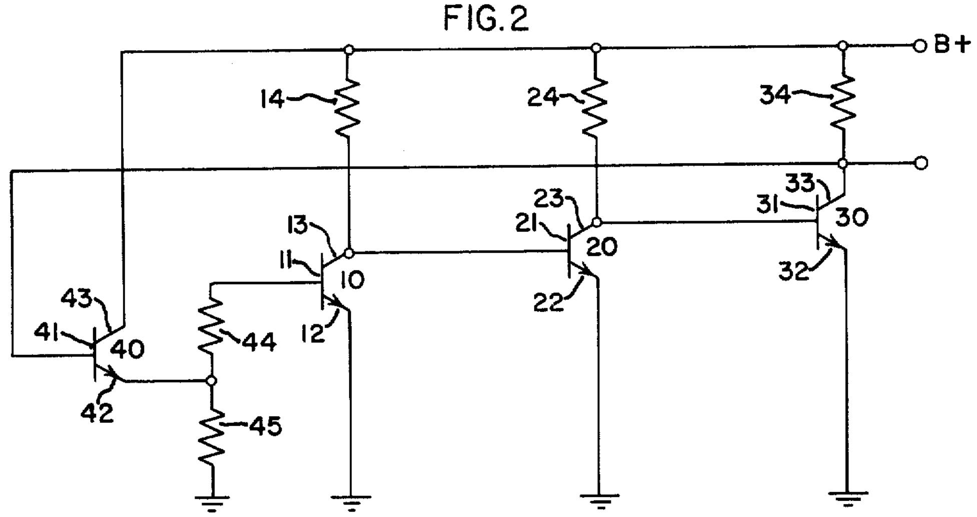
FIG. 2 shows an embodiment of the bias circuit of this invention which achieves proper base bias regardless of B.

The circuit of this invention, as shown in FIG. 2 eliminates the need for testing and the precise resistance selection or fabrication required by the prior art and provides for a more stable bias of collector 33. In the embodiment shown, a transistor 40 is used to supply bias in conjunction with a voltage divider comprising resistances 44 and 45.

The voltage dividing resistances 44 and 45 are connected in series and this series connection of resistances is connected between the base 11 and the emitter 12 of transistor 10. The emitter 42 of transistor 40 is connected to a point mediate resistances 44 and 45. The collector 43 of transistor 40 is connected to a source of DC bias potential. The base 41 of transistor 40 is also connected to the same source of DC bias potential by means of a resistance. Here, for convenience, the load resistance 34 of transistor 30 is used. Essentially, transistor 40 is a DC control amplifier which will hold the DC voltage at the collector of transistor 30 at a substantially constant value since the base-emitter junction of transistor 40 forms an essentially forward conducting diode path from collector 33 through resistor 45 to ground. The DC collector voltage on transistor 30 will remain practically constant despite variation in $\beta$ as well as variation in supply voltage.

In operation, the circuit of FIG. 2 applies base bias current to transistor 10 by means of resistance 44. The base bias current values are between 7–30 $\mu$a for a collector current bias of 1.5 ma for resistance 14 equal to 2kΩ and a DC voltage drop of 3v. This current level flows through resistance 44.

When transistor 10 is in an active mode of operation, the base-to-emitter DC voltage drop is about 0.65v and constant, and the total DC voltage drop across resistance 44 and 45, which are in series across the base and emitter of transistor 10 is thus about 0.65v.

Since 7–30 $\mu$a flows through resistance 44, the drop across resistance 44 varies between 14 and 60 mv. if resistance 44 is 2kΩ. Therefore, if resistance 45 is also 2kΩ, the drop across resistance 45 will be between (0.65v + 0.014) and (0.65v + 0.060) or (0.66v to 0.71v) or approximately (0.68v ± 0.02v) for variations in the $\beta$ of transistor 10 between 50 and 200.

Since the base to emitter DC voltage of transistor 40 is about 0.65v also, the DC voltage at the collector of transistor 30 will be approximately 0.65v + 0.68v ± 0.02v = 1.33v ± 0.02v for $\beta$ between 50 and 200 of transistor 10.

This means that DC collector voltage has been stabilized greatly with respect to the prior art resistance bias method, less than a 2% variation in the voltage with respect to input stage $\beta$ variation. This is a substantial improvement over the 20% variation typical for the prior art.

Figure 3:
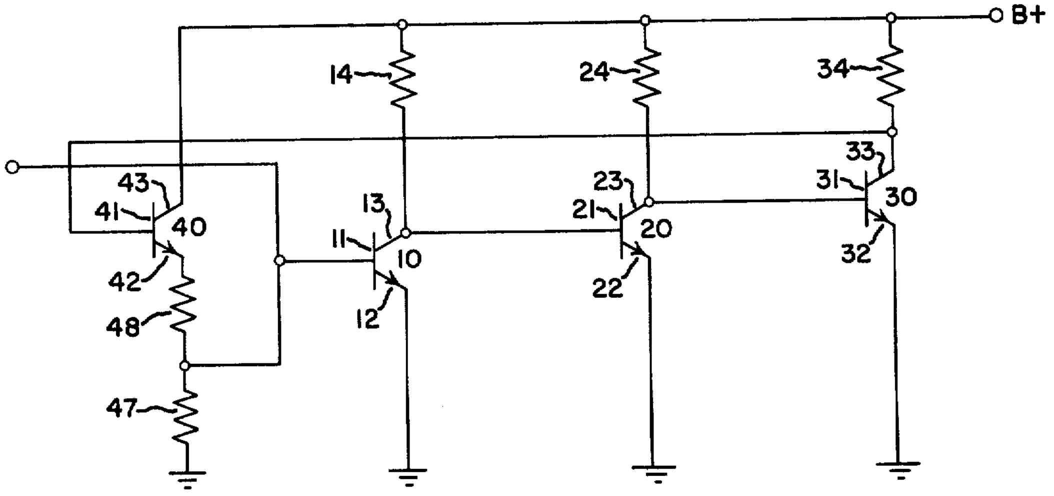
FIG. 3 shows an alternate embodiment of the invention.

An alternate embodiment of the biasing circuit of the invention is shown in FIG. 3. The circuit is the same as that shown in FIG. 2 except that the resistances associated with transistor 40 are connected in series from the emitter 42 of transistor 40 to ground or common potential. These resistances are shown as 47 and 48 in FIG. 3. DC base bias current is supplied to base 11 of transistor 10 by connecting a point mediate resistances 47 and 48 to base 11.

In the circuit of FIG. 3, the collector 13 DC current will again be about 1.5 ma as the resistance 14 and the DC voltage source are 2kΩ and 3v respectively, as in the previous examples. This means that for the transistor 10 to be operated in the active region, a 7 to 30 $\mu$a DC base bias current must be provided for $\beta$ values between 50 and 200 for transistor 10. Such a bias current flows into the base 11 of transistor 10 from a junction between resistances 47 and 48.

In the circuit of FIG. 3, since resistance 47 is connected between the base 11 and emitter 12, the voltage across resistance 47 will be about 0.65v when transistor 10 is in the active stage. If, for example, resistance 47 is 2kΩ, the current through it will be thus about 325 Ωa. The current through resistance 48 will be equal to the base bias current plus the current through resistance 47, and take on levels between 325 $\mu$a + 7 $\mu$a and 325 $\mu$a + 30 $\mu$a or 332 $\mu$a to 355 $\mu$a. If resistance 48 is also 2kΩ, then the DC voltage across resistance 48 will be between 0.63 and 0.65 volts or 0.64v ± 0.01v. The DC voltage at the collector of transistor 30 thus equals the base-to-emitter drop (about 0.65v) of transistor 40 plus the voltage across resistance 48 plus the voltage across resistance 47, that is, 0.65v + 0.64 + 01v + 0.65v or 1.94v ± 0.01v. This shows only a 0.5% variation in DC collector voltage at transistor 30 for $\beta$ variation between 50 and 200 for transistor 10. Also, the voltage across resistance 48 can be increased, and hence the voltage at collector 33 can be raised by making resistance 48 larger with respect to resistance 47, since the current through resistance 48 is substantially constant i.e., 345 $\mu a \pm 10$ $\mu a$ and the base emitter DC voltage of transistors 40 and 10 are also constant. This makes the voltage level at collector 33 adjustable by adjusting the value of resistance 48 with respect to resistance 47.

In both the circuits of FIGS. 2 and 3, the collector voltage at the output transistor of the last stage is maintained constant and independent of the $\beta$ of the first stage transistor by means of placement of PN junction forward conducting voltage drops between that collector and grond, while at the same time using such a junction for a path to provide DC base bias current at the first stage. Because these drops are constant-valued, the DC voltage appearing at the collector of transistor 30 is independent both of $\beta$ of transistor 10 and the DC bias potential source level.

If the DC collector voltage of transistor 30 need be raised, more PN junction forward conducting voltage drops can be placed in the base bias current path. For example, transistor 40 may be replaced by two or more transistors in emitter-follower configuration, providing several more base-to-emitter drops between the collector 33 and ground; one mor more diodes may also be utilized. Such configurations of course, would also be independent as well as independent DC bias potential source levels.

Frequently, it is necessary to use a multistage transistor amplifier in conjunction with the bias circuits of FIG. 2 to amplify alternating current signals at large gain, for example, gains of 500 to 2000. To insure such gain it becomes necessary to prevent the amplified alternating current signal obtained, for example, at the collector 33 from being fed back to base 11 by means of transistor 40 and the resistances 44. A large negative feedback by means of the bias circuit would severely reduce the overall amplifier gain.

Figure 4:
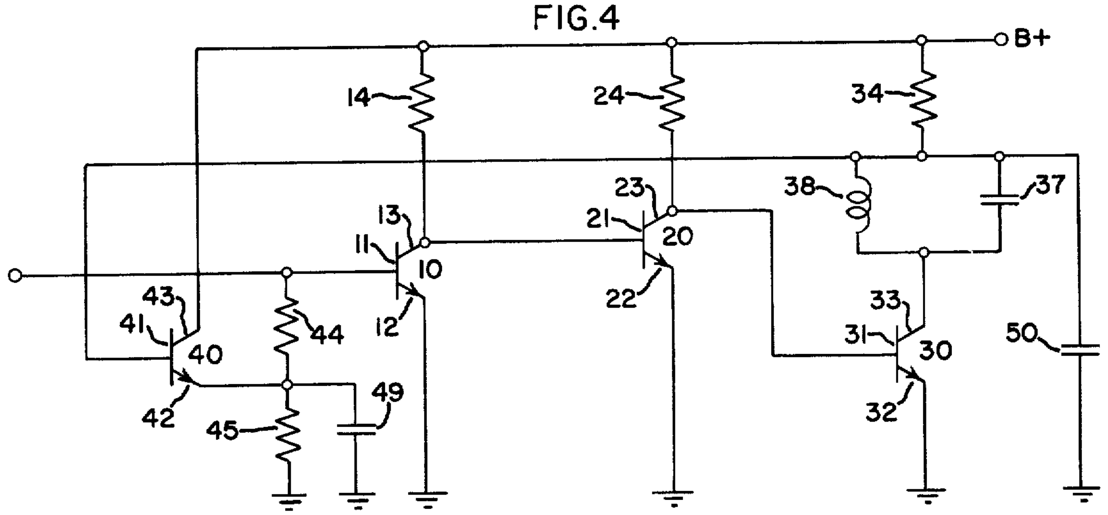
FIG. 4 shows the circuit of FIG. 2 in an AC circuit application.
Figure 5:
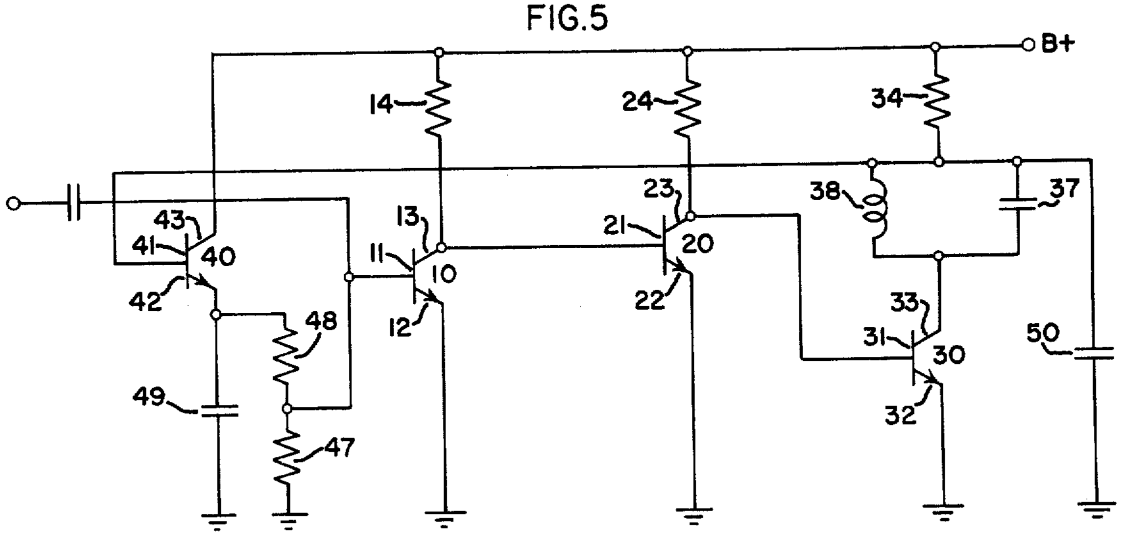
FIG. 5 shows the circuit of FIG. 3 in an AC circuit application.

To prevent excessive AC feedback, the modified circuit shown in FIGS. 4 and 5 is provided.

FIG. 4 shows the circuit of FIG. 2 in a typical application: an intermediate frequency (IF) audio amplifier as commonly found in AM or FM radio receivers. The load on the collector 33 of transistor 30 further includes a tank circuit comprising capacitance 37 and inductances 38 to couple only the intermediate frequency signals to circuitry supplied by the output of the amplifier, as is well known to audio system designers.

In order to prevent the AC IF output signals obtained across the tank circuit from being fed into the base 11 of transistor 10 by means of resistance 44 and the base-to-emitter path of transistor 40, a capacitance 49 is provided between the emitter 42 of transistor 40 and ground or common potential. This capacitance is of such a value that the IF signals are passed directly to ground and not applied at the base 11 of transistor 10.

In a similar manner, if the overall circuit of FIG. 3 is to be used the feedback of AC IF signals is prevented by connecting capacitance 49 between emitter 42 of transistor 40 and ground; such arrangement is shown in FIG. 5, and prevents feedback of IF signals appearing across the tank circuit into the base 11 of transistor 10.

In both the circuits of FIG. 4 or FIG. 5, a capacitor may be placed between the resistor 34 and ground to prevent IF signals from reaching the base of transistor 40 and thus from reaching the base 11 of transistor 10. This prevents negative feedback AC or IF signals to the base of transistor 10 and prevents reduction in overall gain which would result from such feedback.

A biasing circuit for biasing the first stage of a multistage transistor amplifier has been shown which allows biasing independent of $\beta$ in the first stage. Several embodiments of this biasing circuit utilize the constant voltage forward drop across a PN junction to effect base bias of the initial stage of a multistage amplifier and accomplish a constant and $\beta$ independent collector DC voltage for the final stage of a multistage amplifier. Such circuitry eliminates the need for individual testing, breadboarding, and bias resistance selection for individual circuits while at the same time maintaining performance stability regardless of circuit parameter variations.

While having shown embodiments of the invention as contemplated, various other modifications and changes will be apparent to those skilled in the art and such chànges and modifications may be made without departing from the spirit and scope of this invention as defined in the appended claims.

What is claimed as new and desired to be secured by letters patent of the United States is:

1. In a multistage electronic amplifier having first and last stages comprising first and last transistors, each of said transistors having an impedance for connecting one terminal thereof to a direct current bias potential source, a circuit for biasing an input terminal of said first transistor comprising:

a multiterminal semiconductor device developing a substantially constant direct current voltage between two terminals thereof, means for connecting a first terminal of said two terminals of said multiterminal semiconductor device to said one terminal of said last transistor, first and second resistors connected in series between an input terminal of said first transistor and a common point, said first and second resistors having a common terminal mediate said first and second resistors, the second terminal of said two terminals of said multiterminal semiconductor device being connected to said mediate terminal, said multiterminal semiconductor device having a third terminal arranged for connection to a direct current bias potential source, said multiterminal semiconductor device being operative to cause a current to flow into said input terminal of said first transistor to cause said first transistor to be rendered active.

2. The combination of claim 1 wherein said multiterminal semiconductor device is a transistor.

3. The combination of claim 2 wherein said first terminal of said multiterminal semiconductor device is the base terminal of said transistor.

4. The combination of claim 3 wherein sais second terminal of said multiterminal semiconductor device is the emitter terminal of said transistor.

5. The combination of claim 4 wherein said third terminal of said multiterminal semiconductor device is the collector terminal of said transistor.

6. In a multistage electronic amplifier having first and last stages comprising first and last transistors, each of said transistors having an impedance for connecting one terminal thereof to a direct current bias potential source, a circuit for biasing an input terminal of said first transistor comprising:

a multiterminal semiconductor device developing a substantially constant direct current voltage between two terminals thereof, means for connecting a first terminal of said two terminals of said multiterminal semiconductor device to said one terminal of said last transistor, first and second resistors connected in series between the second terminal of said two terminals of said multiterminal semiconductor device and a common point, said first and second resistors having a common terminal mediate said first and second resistors, means connecting an input terminal of said first transistor to said mediate terminal, said multiterminal semiconductor device having a third terminal arranged for connection to a direct current bias potential source whereby said multiterminal semiconductor device provides a current to said input terminal of said first transistor by means one of said resistors to cause said first transistor to be rendered active.

7. In a multistage electronic amplifier having first and last stages comprising first and last transistors, each of said transistors having an impedance for connecting one terminal thereof to a direct current bias potential source, a circuit for biasing an input terminal of said first transistor comprising:

a multiterminal semiconductor device developing a substantially constant direct current voltage between two terminals thereof, means connecting one terminal of said two terminals of said multiterminal semiconductor device to said one terminal of said last transistor, a first resistance path connecting the second terminal of said two terminals of said multiterminal semiconductor device to an input terminal of said first transistor to supply a first fraction of the current flowing from said second terminal to said input terminal, a second resistance path connecting said second terminal to a common point to conduct to ground the remaining fraction of said current flowing from said second terminal.

8. The combination of claim 7 wherein said multiterminal semiconductor has a third terminal arranged for connection to a direct current bias potential source.

* * * * *